United States Patent [19]

Traa

[11] 4,267,516
[45] May 12, 1981

[54] COMMON-EMITTER $F_T$ DOUBLER AMPLIFIER EMPLOYING A FEED FORWARD AMPLIFIER TO REDUCE NON-LINEARITIES AND THERMAL DISTORTION

[75] Inventor: Einar O. Traa, Portland, Oreg.

[73] Assignee: Tektronix, Inc., Beaverton, Oreg.

[21] Appl. No.: 63,606

[22] Filed: Aug. 3, 1979

[51] Int. Cl.³ .......................... H03F 1/26; H03F 3/45
[52] U.S. Cl. .................................. 330/149; 330/252; 330/272
[58] Field of Search ............... 330/252, 149, 271, 272

[56] References Cited

U.S. PATENT DOCUMENTS 3,633,120  1/1972  Battjes .................................. 330/271
4,146,844  3/1979  Quinn .................................. 330/149

Primary Examiner—Alfred E. Smith
Assistant Examiner—T. N. Grigsby
Attorney, Agent, or Firm—George T. Noe

[57] ABSTRACT

An improved common-emitter cascode $f_T$ doubler amplifier is provided with a feed-forward amplifier circuit to compensate for non-linearities and thermal distortion. The feed forward amplifier senses distortion at the emitters of the $f_T$ doubler amplifier transistors and injects a correction current into a pair of output nodes. The amplifier is also provided with a common-base transistor output stage.

2 Claims, 2 Drawing Figures

COMMON-EMITTER $F_T$ DOUBLER AMPLIFIER EMPLOYING A FEED FORWARD AMPLIFIER TO REDUCE NON-LINEARITIES AND THERMAL DISTORTION

BACKGROUND OF THE INVENTION

The present invention relates to transistor amplifiers in general, and in particular to a common-emitter cascode $f_T$ doubler transistor amplifier employing a feed forward non-linearity and thermal-distortion correction path.

Common-emitter cascode transistor amplifiers are very popular for use in oscilloscopes and other precision measurement instruments requiring high-bandwidth operation. One such common-emitter transistor amplifier exhibiting an $f_T$ characteristic that is substantially doubled is described in U.S. Pat. No. 3,633,120, which is assigned to the assignee of the present invention. The so-called $f_T$ doubler amplifier includes first and second pairs of transistors wherein the outputs of the transistor pairs are coupled in parallel while a common input current its provided in series to the four transistors to substantially double the current gain at the upper −3dB point. However, this amplifier exhibits certain non-linearities and thermal distortions which are inherent in the fundamental physical properties of the semiconductor pn junctions that are employed.

A feed-forward non-linearity and thermal distortion technique for common-emitter transistor amplifiers has been developed and is taught in U.S. Pat. No. 4,146,844, which is also assigned to the assignee of the present invention. While the feed forward technique has been applied two-transistor differential amplifiers, it would be desirable to apply this technique to the four-transistor $f_T$ doubler amplifier configuration as well.

SUMMARY OF THE INVENTION

According to the present invention, an improved common-emitter cascode $f_T$ doubler amplifier is provided with a feed-forward circuit to compensate for non-linearities and thermal distortion. The improved $f_T$ doubler-circuit provides an improvement over the basic feed-forward cascode amplifier as well, in that the common-base output transistors are not forced to be on the same load line as the common-emitter input transistors, providing a more flexible amplifier and avoiding the DC voltage buildup exhibited by the basic feed forward cascode amplifier.

In a preferred embodiment of the present invention, a first resistor couples the emitter terminals of the first pair of transistors, while a second resistor couples the emitter terminals of the second pair of transistors. An input current is supplied between a base terminal of the first pair and a base terminal of the second pair, while the other two base terminals are connected together to complete an input series current path. The first and second pairs of common-emitter-coupled transistors have their collector outputs paralleled in an inphase, current-aiding sense to provide a pair of current nodes, which in turn are coupled to the emitters of a pair of common-base output transis-tors. A feed forward amplifier having gain characteristics substantially equal to the four-transistor $f_T$ doubler amplifier configuration has its two inputs coupled to the respective emitters of the basecoupled input transistors and its two outputs coupled to the respective current nodes. The feed forward amplifier senses the distortion of the main amplifier channel across its inputs and generates an error-correction current which is injected into the output current nodes to provide an overall amplifier output which is free of logarithmic non-linearities and thermal distortion.

It is therefore one object of the invention to provide an improved common-emitter cascode $f_T$ doubler amplifier provided with a feed forward amplifier circuit to compensate for non-linearities and thermal distortion.

It is another object to provide an improved common-emitter cascode $f_T$ doubler amplifier which also provides an improvement over the basic feed-forward cascode amplifier by sensing the distortion at the amplifier input and injecting a correction signal into the output.

Other objects and advantages of the present invention will become apparent to those having ordinary skill in the art when taken in conjunction with the accompanying drawings.

DETAILED DESCRIPTION OF THE INVENTION

Figure 1:
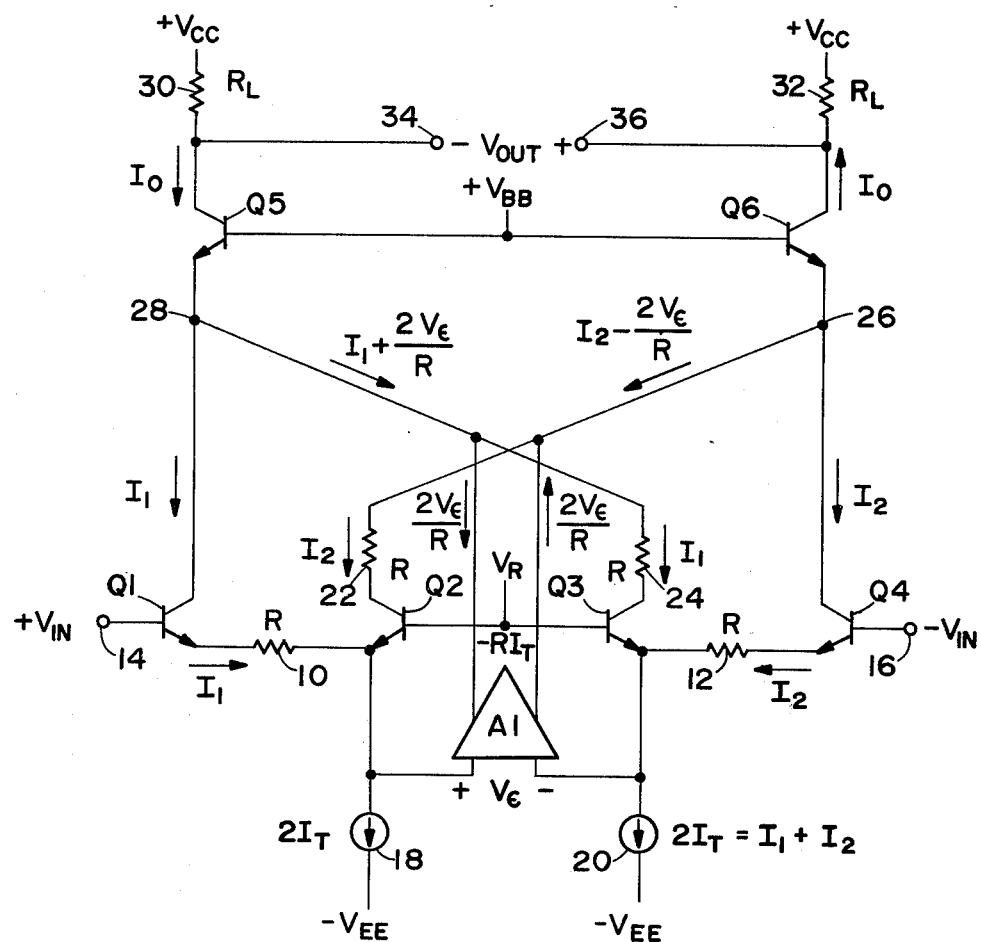
FIG. 1 is a schematic diagram of a common emitter cascode $f_T$ doubler amplifier employing a feed forward amplifier in accordance with the present invention.
Figure 2:
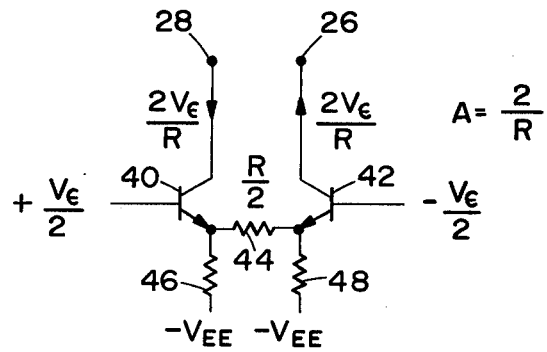
FIG. 2 is a schematic diagram of a feed forward amplifier for use with the circuit of FIG. 1.

Referring to FIG. 1, the amplifier according to the present invention includes a first pair of transistors Q1 and Q2, the emitters of which are coupled together through a resistor 10, and a second pair of transistors Q3 and Q4, the emitters of which are coupled together through a resistor 12. Input signals $+V_{in}$ and $-V_{in}$ are applied via input terminals 14 and 16 to the bases of transistors Q1 and Q4 respectively. The bases of transistors Q2 and Q3 are connected together to a reference voltage $V_R$ to complete the input series current path. The emitters of transistors Q2 and Q3 are connected to a suitable negative voltage supply $-V_{EE}$ through constant current sinks 18 and 20 respectively. The collectors of transistors Q2 and Q3 are cross-coupled through resistors 22 and 24 to the collectors of transistors Q4 and Q1 respectively, forming current-summing nodes 26 and 28 respectively. This is the basic $f_T$ doubler amplifier taught by the aforementioned U.S. Pat. No. 3,633,120. The emitter of a transistor Q5 is connected to current node 28, while the base thereof is connected to a suitable source of bias voltage $+V_{BB}$ and the collector thereof is connected through a load resistor 30 to a suitable positive voltage supply $+V_{cc}$. Similarly, the emitter of a transistor Q6 is connected to current node 26, while the base thereof is connected to the bias voltage supply $+V_{BB}$ and the collector thereof is connected through a load resistor 32 to the positive voltage supply $+V_{cc}$. A differential output signal $V_{out}$ is made available via output terminals 34 and 36, which are connected respectively to the collectors of transistors Q5 and Q6. A feed forward amplifier A1 has its differential inputs connected to emitters of transistors Q2 and Q3 respectively, while the differential outputs of amplifier A1 are coupled to the current-summing nodes 28 and 26 in a current-aiding sense. Amplifier A1 may take many forms; however, an example of a simple configuration suitable for use as amplifier A1 is shown in FIG. 2. Here a differential amplifier comprises a pair of transistors 40 and 42, the emitters of which are coupled together through a resistor 44. The emitter of transistor 40 is connected through a large resistor 46 to the negative voltage supply $-V_{EE}$, while the collector thereof is coupled to the current-summing node 28. Similarly, the emitter of transistor 42 is connected through a large resistor 48 to the negative voltage supply $-V_{EE}$, while the collector thereof is coupled to the current-summing node 26. A differential error signal $V_E$ is applied across the bases of transistors 40 and 42.

The non-linearity and thermal distortion correction operation of the FIG. 1 circuit is best understood in terms of mathematical relationships. It is assumed that transistors Q1, Q2, Q3, and Q4 have matched parameters. Further, it is assumed that transistors Q1 and Q3 are operationally matched so that both transistors have identical voltages, currents, and operating points. Likewise, transistors Q2 and Q4 are operationally matched so that both transistors have identical voltages, currents, and operating points. Resistors 10, 12, 22, and 24 are matched and each has a resistance value R. Therefore, equal currents $I_1$ flow through transistors Q1 and Q3, and likewise, equal currents $I_2$ flow through transistors Q2 and Q4. The summation of currents $I_1$ and $I_2$ on each side of the amplifier is equal to $2 I_T$, the amount of current sank by each of the constant current sinks 18 and 20. Under dynamic conditions, a signal current component $I_s$ is generated, and is equal to $\frac{1}{2}I_1 - \frac{1}{2}I_2$. The value of reference voltage $V_R$ should be set to $-RI_T$ to balance the bases of transistors Q2 and Q3 with transistors Q1 and Q4.

The differential input voltage between terminals 14 and 16 may be written as $$2V_{in} = 2RI_s + 2(kT/q)\ln(I_1/I_2) + 2\Delta V_{TH} \tag{1}$$

where k is the Boltzmann constant, T is the absolute temperature, q is the charge on an electron, and $\Delta V_{TH}$ represents all systematic deviations from the pure logarithmic junction equation, thermal and otherwise.

With output terminals 34 and 36 shorted together, the output loop current may be expressed as $$I_o = 2I_s + 2V_E/R = 2I_s + 2[(kT/q)\ln(I_1/I_2) + \Delta V_{TH}]/R \tag{2}$$

where $V_E$ is the differential error voltage caused by non-linearities and thermal distortion.

From equations (1) and (2), the total transconductance, or gain, of the amplifier of FIG. 1 may be expressed as $$I_o/2V_{in} = 1/R \tag{3}$$

Since the feed forward correction amplifier A1 effectively senses only one-half the error voltage, the gain thereof should be adjusted to twice that of the overall amplifier, or $A = 2/R$. This may be achieved by making the resistance value of resistor 44 in FIG. 2 equal to R/2. It should be noted for this discussion that ideal transistors are assumed and that the various junction impedances have not been taken into account. In actual practice, the value of resistor 44 will have to be adjusted so as to include emitter resistances, and, in addition, it may be possible to completely eliminate resistors 22 and 24, depending upon the collector impedances of the devices, the architecture used, and the degree of perfection needed.

While the foregoing discussion is based on the utilization of bipolar transistors, the principles set forth may be extended to other active devices, such as field-effect transistors or even vacuum tubes, where V(I) is the input voltage of a devices with current I. For the general case, the differential error voltage $V_E$ may be expressed as $V(I_1) - V(I_2)$, so that the differential input voltage may be expressed as $$2V_{in} = 2RI_s + 2[V(I_1) - V(I_2)], \tag{4}$$

the output loop current may be expressed as $$I_o = 2I_s + 2[V(I_1) - V(I_2)]/R, \tag{5}$$

and the total amplifier transconductance reduces to 1/R as shown by equation (3).

The improved common-emitter cascode $f_T$ doubler amplifier of FIG. 1 in practical applications, such as implementation in monolithic integrated circuits, not only exhibits substantially reduced non-linearity and thermal distortion, but provides an improvement over the basic feed forward cascode amplifier as well in that the common-base transistors Q5 and Q6 are not forced to be on the same load line as transistors Q1, Q2, Q3, and Q4.

While I have shown and described a preferred embodiment of my invention, it will be apparent to those skilled in the art that many changes and modifications may be made without departing from my invention in its broader aspects. The appended claims therefore cover all such changes and modifications as fall therewithin.

What I claim as being new is:

1. An improved amplifier circuit for producing enhanced current gain at high frequencies comprising a first pair of emitter-coupled transistors, the collectors of which are coupled respectively to first and second current nodes, a second pair of emitter-coupled transistors, the collectors of which are also coupled respectively to said first and second current nodes to provide an in-phase current output in parallel with the current-output of said first pair of transistors, wherein the improvement comprises:

a feed forward amplifier having a pair of input terminals coupled respectively to the emitters of said first and second pairs of transistors to sense the distortion produced thereby, and a pair of outputs coupled respectively to said first and second current nodes to inject a correction current into the output currents of said first and second pairs of transistors; and a pair of common-base transistors, the emitters of which are respectively coupled to said first and second current nodes to provide a substantially error free output current at the collectors thereof.

2. An improved amplifier circuit in accordance with claim 1 wherein said feed forward amplifier comprises a differential amplifier having a transconductance equal to twice the transconductance of the amplifier provided by said first and second pairs of transistors.

* * * * *